(12) United States Patent
Tsuchida et al.

(10) Patent No.: US 7,109,273 B2
(45) Date of Patent: Sep. 19, 2006

(54) SOLID SILANE COUPLING AGENT COMPOSITION, PROCESS FOR PRODUCING THE SAME, AND RESIN COMPOSITION CONTAINING THE SAME

(75) Inventors: Katsuyuki Tsuchida, Kitaibaraki (JP); Masashi Kumagai, Hitachi (JP)

(73) Assignee: Nikko Materials Co., Ltd., Tokyo (JP)

( * ) Notice: Subject to any disclaimer, the term of this patent is extended or adjusted under 35 U.S.C. 154(b) by 394 days.

(21) Appl. No.: 10/480,712

(22) PCT Filed: Aug. 5, 2003

(86) PCT No.: PCT/JP03/09967

§ 371 (c)(1),
(2), (4) Date: Dec. 11, 2003

(87) PCT Pub. No.: WO2004/037880

PCT Pub. Date: May 6, 2004

(65) Prior Publication Data
US 2005/0165195 A1    Jul. 28, 2005

(30) Foreign Application Priority Data
Oct. 28, 2002    (JP) .............................. 2002-312712

(51) Int. Cl.
*C08G 65/48*    (2006.01)
(52) U.S. Cl. ............................ 525/393; 528/29; 528/38
(58) Field of Classification Search .................. 525/393
See application file for complete search history.

(56) References Cited

U.S. PATENT DOCUMENTS 6,350,799 B1    2/2002    Wang

FOREIGN PATENT DOCUMENTS

| EP | 0 421 390 A | 4/1991 |
| EP | 1 452 535 A | 9/2004 |
| JP | 59-181036 | 10/1984 |
| JP | 61-207477 A * | 9/1986 |
| JP | 3-281618 | 12/1991 |
| JP | 5-39295 | 2/1993 |
| JP | 5-186479 | 7/1993 |
| JP | 7-17739 | 3/1995 |
| JP | 7-94534 | 10/1995 |
| JP | 25-06220 | 4/1996 |
| JP | 9-67427 | 3/1997 |
| JP | 9-241576 | 9/1997 |
| JP | 9-295988 | 11/1997 |
| JP | 9-295989 | 11/1997 |
| JP | 9-295992 | 11/1997 |
| JP | 9-296135 | 11/1997 |
| JP | 10-130468 | 5/1998 |
| JP | 10-130468 A * | 5/1998 |
| JP | 2000-297094 | 10/2000 |
| JP | 2001 031841 A | 2/2001 |
| JP | 2001-279054 | 10/2001 |
| JP | 2002-128867 | 5/2002 |
| WO | WO 03/048170 A | 6/2003 |

OTHER PUBLICATIONS

Supplementary European Search Report dated Dec. 20, 2005 (3 pages).

* cited by examiner

*Primary Examiner*—Marc S Zimmer
(74) *Attorney, Agent, or Firm*—Flynn, Thiel, Boutell & Tanis, P.C.

(57) ABSTRACT

It is an object of the present invention to provide a non-gelling solid silane coupling agent which enhances adhesion of a resin composition to metals and so forth when added to the resin composition, and which has excellent storage stability and molten fluidity.

The present invention is a non-gelling, pulverizable, solid silane coupling agent composition composed of a reaction product of the following components.
 (A) 1 to 40 wt % of a silane coupling agent containing one or more functional groups from among a vinyl group, glycidyl group, styryl group, methacryl group, acryl group, ureido group, chloro alkyl group, mercapto group, and isocyanate group
 (B) 1 to 40 wt % of a silane coupling agent containing one or more functional groups from among an amino group, dimethylamino group, and imidazole group
 (C) 50 to 90 wt % of a phenol compound

11 Claims, 3 Drawing Sheets ved, condensation between the silanes is less likely to occur in the removal of the alcohol produced by the reaction between the silane coupling agent and the phenol resin, and
SOLID SILANE COUPLING AGENT COMPOSITION, PROCESS FOR PRODUCING THE SAME, AND RESIN COMPOSITION CONTAINING THE SAME

TECHNICAL FIELD

This invention relates to a solid silane coupling agent that improves the adhesion of a resin to metals, inorganic materials, and organic materials and also improves the fluidity and storage stability of a resin composition. This invention can be used in the fields of electronic materials, paints, primers, adhesives, and so on, but is particularly suited to the field of liquid resin compositions that need to be latently curable but also have good storage stability when not heated, or additives for powdered compositions such as powder paints or sealing materials used in electronic materials.

BACKGROUND ART

In the electronic materials field, there has been a trend in recent years toward making components lighter, thinner, and smaller, as well as toward using solder that is free of halogens, antimony, and lead, while at the same time even higher performance is being required of sealing materials and so forth.

Conventional semiconductor sealing resins, for instance, have been epoxy resin compositions obtained by curing a novolac epoxy resin with a phenol novolac resin.

However, as the high integration of semiconductors has increased, there has been a move toward lead-free solder in an effort to reduce package size and thickness and because of environmental concerns, and furthermore the requirements on sealing resins have been increasingly strict each year due to the development of pre-plated lead frames and so forth, which has made it difficult to ensure good reliability with conventional epoxy resin compositions. Specific characteristics that are required include adhesion to chips and lead frames, and in particular that there be no cracking, interfacial separation, or the like if [the resin composition] is immersed in solder after absorbing moisture.

In the field of paints, solvent-based paints are commonly used, but pollution restrictions targeting organic solvents have become stiffer and their enforcement is rapidly becoming a reality. In light of this situation, powder paints that contain no organic solvent whatsoever have been attracting attention. However, it is more difficult to obtain a thin film with these powder paints than with a solvent-based paint, and smoothness is also inferior. Along with these and other problems, polyester-based powder paints are said to have particularly low secondary adhesion to metals and the like.

The typical means for improving the adhesion of a resin to a metal or inorganic material is to add a silane coupling agent to the resin or subject the resin to a surface treatment with this agent.

With the above-mentioned sealing materials, epoxy-, amino-, and mercapto-based silane coupling agents are the most effective and have been in use for years, but with the above-mentioned environmental concerns and the move toward lighter, thinner, and smaller components in recent years, it is now increasingly common for the required characteristics to remain elusive. Also, since powder paints and the majority of sealing materials are in the form of powders, liquid silane coupling agents pose problems in terms of uniform mixing and ease of handling. There has been a need for a solid silane coupling agent that would meet these requirements, but none is commercially available at this time, so liquid silane coupling agents still have to be used.

It has already been proposed that a silane coupling agent be mixed and reacted with a phenol resin, and the resulting reaction product be used as the epoxy resin composition component in sealing material applications (Patent Documents 1 to 6). Since the silane coupling agent is in liquid form, this reaction product can be pulverized in solid form if the ratio of silane coupling agent/phenol resin is low, but as the proportion of silane coupling agent increases, the reaction product gradually becomes softer (its softening point decreases) and it can no longer be pulverized. Although it varies with the silane coupling agent, a silane coupling agent containing one or more functional groups from among a vinyl group, glycidyl group, styryl group, methacryl group, acryl group, ureido group, chloro alkyl group, mercapto group, and isocyanate group cannot be pulverized unless contained in an amount of just a few percent to no more than 10% (with the remainder being phenol resin).

A method in which an alcohol is removed after the mixing of silane coupling agents is discussed in Patent Documents 2 to 5. The softening point rises when an alcohol is removed, but a condensation reaction between the silane coupling agents produces siloxane bonds and gelling, so the anticipated increase in adhesive strength is not always achieved. Meanwhile, with a basic silane coupling agent containing one or more functional groups from among an amino group, dimethylamino group, and imidazole group, the amino, dimethylamino, or imidazole groups become a catalyst in the hydrolysis of the alkoxysilyl groups in the silane coupling agent, which tends to accelerate the reaction of the phenol with hydroxyl groups and the condensation reaction between the silane coupling agents, so the product tends to be a solid. Nevertheless, because these basic silane coupling agents have such strong catalytic activity, they do increase adhesive strength when added to a sealing material, but they also lower fluidity, which makes problems more apt to occur in transfer molding.

A method involving a reaction (mixing) between a phenol resin and a silane coupling agent is discussed in Patent Documents 2 to 5. All of these patents involve mixing a silane coupling agent with a phenol resin at high temperature, and removing the alcohol that is produced. Here, as mentioned above, solidification occurs with no problem if the silane coupling agent content is only a few percent (with the rest being phenol resin), but the action of the silane coupling agent as a phenol resin curing agent is too strong, so the resulting reaction product is more accurately called a phenol resin modified with a silane agent rather than a solid silane coupling agent, with substantially all of the alkoxysilane groups (SiOR groups) being consumed. As a result, an adequate coupling effect is not obtained, and the increase in adhesion is still inadequate. Also, since a phenol resin acts as a curing agent on epoxy resins, when one is added to an epoxy resin composition, it upsets the epoxy resin/curing agent ratio. When a phenol resin is the curing agent, the amount of phenol resin added should be controlled, but with other curing agents problems with characteristics are sometimes encountered. Accordingly, the silane coupling agent content in a solid coupling agent should be as high as possible.

On the other hand, if the silane coupling agent content is raised, condensation between the silanes is less likely to occur in the removal of the alcohol produced by the reaction between the silane coupling agent and the phenol resin, and the gelling that occurs prevents dissolution in the solvent. This gelled reaction product is difficult to mix with the resin when a resin composition is heated and melted and subjected to a curing reaction, the coupling effect of the silane coupling agent is inadequate, and the desired increase in adhesion is not realized.

Because of this, it is stated in paragraph 0032 of Patent Document 4 that the proportion of a silane coupling agent to a phenol resin is 0.1 to 50 wt %, and preferably 1 to 30 wt %, but because of the need for solidification, the amount is given as 10 wt % or less in the actual examples. In the examples given in Patent Documents 2, 3, and 5, the silane coupling agent content is also given as 10 wt % or less.

Patent Document 1: Japanese Patent Publication 7-17739B
Patent Document 2: Japanese Patent No. 2,506,220
Patent Document 3: Japanese Patent Publication 7-94534B
Patent Document 4: Japanese Patent Publication 9-67427A
Patent Document 5: Japanese Patent Publication 2002-128867A
Patent Document 6: Japanese Patent Publication 59-181036A

DISCLOSURE OF THE INVENTION

In light of the above, the present invention provides a solid silane coupling agent that will not gel, and more particularly it is an object thereof to provide a solid silane coupling agent that improves the adhesion of a resin composition to metals and other such substrates and also improves the molten fluidity and storage stability of this resin composition, when added to the resin composition, and to a method for manufacturing this agent. It is a further object to provide a resin composition, powder paint, and sealing material containing this silane coupling agent.

As a result of diligent study, the inventors discovered a solid silane coupling agent obtained by reacting the following (A) to (C).

Specifically, the present invention is:

(1) a non-gelling, pulverizable solid silane coupling agent composition comprising a reaction product of the following components:
(A) 1 to 40 wt% of a silane coupling agent containing one or more functional groups selected from the group consisting of a vinyl group, glycidyl group, styryl group, methacryl group, acryl group, ureido group, chloro alkyl group, mercapto group, and isocyanate group;
(B) 1 to 40 wt% of a silane coupling agent containing one or more functional groups selected from the group consisting of an amino group, dimethylamino group, and imidazole group; and
(C) 50 to 90 wt% of a phenol compound.

(2) A method for manufacturing a non-gelling, pulverizable, solid silane coupling agent composition, the method comprising:
causing the above-mentioned silane coupling agent (A), the above-mentioned silane coupling agent (B), and a phenol compound (C) to react in the presence of an alcohol at 60 to 150° C.; and
drying the reaction product at 90 to 150° C.

(3) A method for manufacturing a non-gelling, pulverizable, solid silane coupling agent composition, the method comprising:
adding the above-mentioned silane coupling agent (A), and a mixed solution of the above-mentioned silane coupling agent (B) and the alcohol to the phenol compound (C) that has been melted by heating at 60 to 150° C.;
causing the resultant mixture to react at 60 to 150° C.; and
drying the reaction product at 90 to 150° C., whereby the silane coupling agent composition is obtained.

(4) A non-gelling, pulverizable, solid silane coupling agent composition, obtained by causing the above-mentioned silane coupling agent (A) the above-mentioned silane coupling agent (B) and the above-mentioned phenol compound (C) to react in the presence of an alcohol at 60 to 150° C., and then drying the reaction product at 90 to 150° C.

(5) The non-gelling, pulverizable, solid silane coupling agent composition according to (1) above, wherein the phenol compound (C) is a phenol resin.

(6) The non-gelling, pulverizable, solid silane coupling agent composition according to (1), (4), or (5) above, wherein the combined amount of the silane coupling agents (A) and (B) is at least 10 wt %.

(7) A resin composition containing the non-gelling, pulverizable, solid silane coupling agent composition according to (1) above.

(8) The resin composition according to (7) above, containing an inorganic filler.

(9) A cured resin, obtained by heating the resin composition according to (7) or (8) above.

(10) A powder paint containing the non-gelling, pulverizable, solid silane coupling agent composition according to any of (1), (4), (5), and (6) above.

(11) A sealing material containing the non-gelling, pulverizable, solid silane coupling agent composition according to any of (1), (4), (5), and (6) above.

BEST MODE FOR CARRYING OUT THE INVENTION

Figure 1:
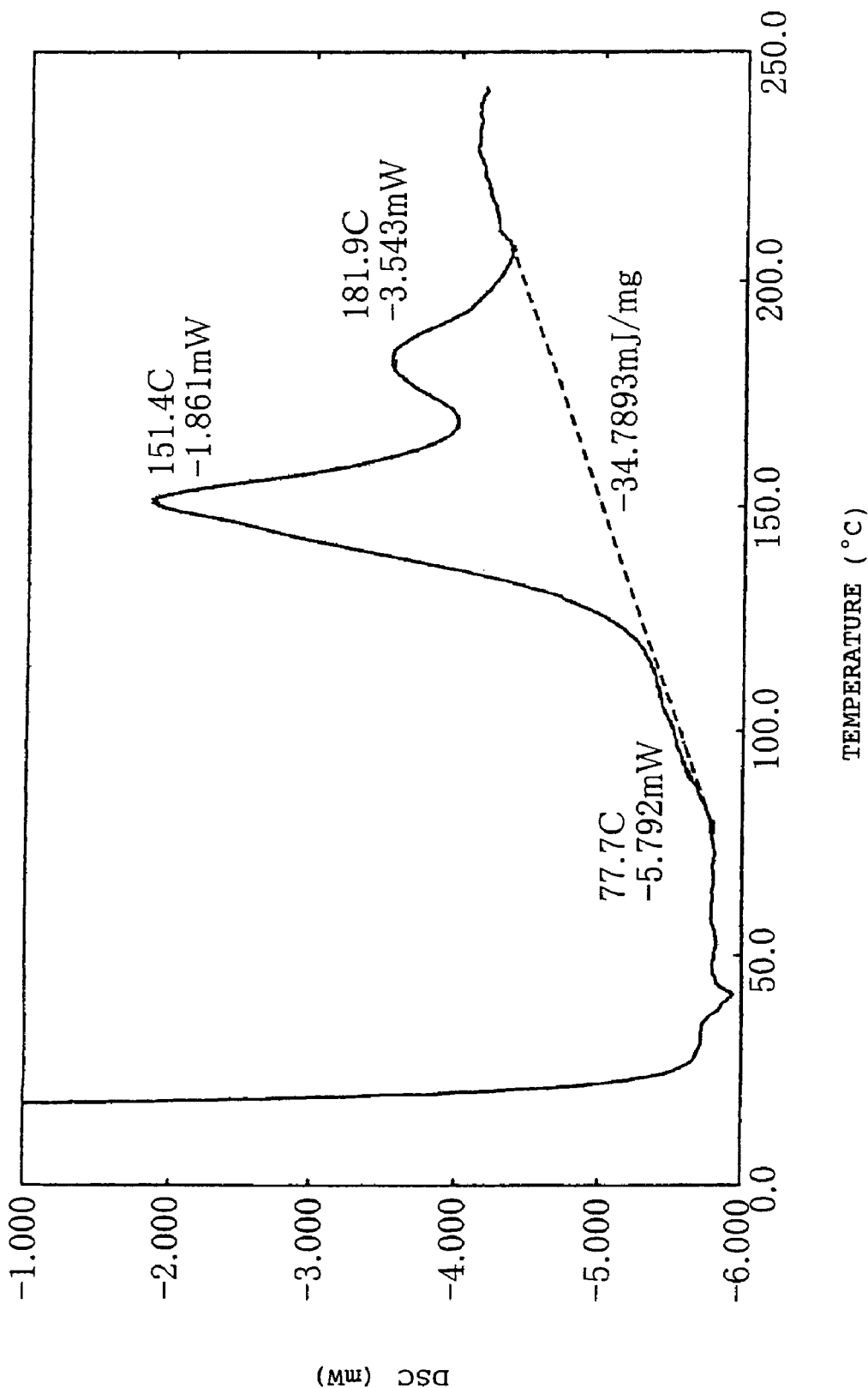
FIG. 1 is a graph of the differential scanning calorimetric curve (DSC curvel obtained in Example 8.

As discussed above, the solid silane coupling agent of the present invention is a reaction product of components (A), (B), and (C).

To obtain this solid silane coupling agent, it is important that an alcohol be present during the reaction. With a conventional method in which a phenol resin and a silane coupling agent are merely mixed and reacted, the reaction activity of component (B) is too strong, which accelerates hydrolysis and condensation and results in undesirable gelling, but a pulverizable solid is obtained without any gelling with the manufacturing method of the present invention.

Specifically, the difference between a conventional method and the manufacturing method of the present invention is the addition of an alcohol in the reaction of the above-mentioned components (A), (B), and (C), and it was confirmed that this prevents gelling even if the combined amount of the silane coupling agents (A) and (B) is no less than 10 wt %. It was also confirmed that because the silane coupling agent of the present invention is in solid form and easy to pulverize, it can be easily added to a powder paint or a powdered sealing material, and increases adhesion of them to metals and so forth. Also, since it is in solid form, it has excellent storage stability (or has latent curing properties that allow it to react and cure only when heated, and not at room temperature), it can be used in the field of liquid resin compositions such as paints, varnishes, and resists that need to have such latency.

The silane coupling agent containing one or more functional groups from among a vinyl group, glycidyl group, styryl group, methacryl group, acryl group, ureido group, chloro alkyl group, mercapto group, and isocyanate group serving as the component (A) used in the present invention is readily available on the market.

Examples include vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, 3-ureidopropyltriethoxysilane, 3-chloropropyltrimethoxysilane, 3-mercaptopropylmethyldimethoxysilane, 3-mercaptopropyltrimethoxysilane, and 3-isocyanatopropyltriethoxysilane.

Examples of the silane coupling agent containing one or more functional groups from among an amino group, dimethylamino group, and imidazole group serving as the component (B) in the present invention include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane, N-(vinylbenzyl)-2-aminoethyl-3-aminopropyltrimethoxysilane, and the compounds listed in Japanese Patent Publications 05-186479A, 05-039295A, 09-295988A, 09-296135A, 09-295989A, 09-295992A, 2000-297094A, and elsewhere.

Any phenol compound can be used in the present invention as long as it has one or more phenolic hydroxyl groups in its molecule and has a softening point or melting point of at least 60° C., favorable examples of which include bisphenol A, bisphenol F, polyvinylphenol, phenol novolac resin, cresol novolac resin, bisphenol A novolac resin, bisphenol F novolac resin, aralkylphenol resin, and other such phenol resins.

The mixing ratio in the reaction of the components (A), (B), and C is (1 to 40 wt %):(1 to 40 wt %):(50 to 90 wt %), and preferably (5 to 20 wt %):(5 to 20 wt %):(60 to 85 wt %).

If the silane coupling agent content is too high, solidification and pulverization will be difficult and gelling will tend to occur, so (A)+(B) is preferably no more than 40 wt %.

The reaction is conducted under heating to between 60 and 150° C. while the components (A), (B), and (C) are stirred in the presence of an alcohol. It is important in the present invention that an alcohol be present during the reaction, but there are no particular restrictions on the order in which the above components are mixed. Preferably, the above-mentioned silane coupling agent (A) or the above-mentioned silane coupling agent (B) is added as a mixed solution with an alcohol while a heated and melted phenol compound is stirred, the reaction is allowed to proceed under stirring for between 10 minutes and 2 hours at 60 to 150° C., and the reaction product is then dried for between 5 minutes and 2 hours at 90 to 150° C. The alcohol here can be methanol, ethanol, n-propanol, isopropanol, n-butanol, tert-butanol, or the like.

If the organic groups of the alcohol are too large, many will remain in the solid silane coupling agent after drying, which lowers the softening point. On the other hand, if the organic groups in the alcohol are too small, they will evaporate right away during drying, which raises the softening point, but also makes gelling more apt to occur. Because of this, preferable alcohols include ethanol, n-propanol, and isopropanol.

The silane coupling agent of the component (A) should be selected according to the type of the resin composition in which the silane coupling agent will be used. For example, with an epoxy resin composition used as a sealing material or the like, silane coupling agents containing glycidyl groups and mercapto groups are favorable, whereas silane coupling agents containing vinyl groups, styryl groups, methacryl groups, acryl groups, and mercapto groups are favorable for a polyester-based powder paint.

When added to a resin, the solid silane coupling agent of the present invention improves the adhesion of the resin to metals, glass, ceramics, and other inorganic materials. This resin can be an epoxy resin, acrylic resin, phenol resin, unsaturated polyester resin, urethane resin, silicone resin, polyimide resin, or the like, and the coupling agent composition of the present invention can be used as an additive in sealing materials, laminated boards, resists, paints, primers, adhesives, and so forth. Also, since the silane coupling agent of the present invention is a solid, it acts as a latent curing agent on epoxy resins and other such thermosetting resins.

Furthermore, the solid silane coupling agent of the present invention can be easily pulverized and added to a powder paint. Similarly, it improves the adhesion of the powder paint to an article to be coated therewith. Examples of such powder paints include polyester resin powder paints, epoxy resin powder paints, acrylic resin powder paints, hybrid powder paints, polyurethane powder paints, and TGIC (triglycidyl isocyanurate) powder paints.

The silane coupling agent of the present invention is easy to pulverize as mentioned above, and after pulverization, silica or another such anti-blocking agent can be added to prevent blocking.

Also, in the present invention, in addition to the solid silane coupling agent of the present invention, another silane coupling agent expressed by the above-mentioned (A) or (B) can be added as needed to the resin composition.

EXAMPLES

The present invention will now be described through reference to examples, but the present invention is not limited by these examples. The blend proportions in the following examples are given in weight parts.

Synthesis and Solubility Testing of Solid Silane Coupling Agent

Example 1

80 g of a phenol novolac resin (softening point: 100° C.) was heated to 120° C. and melted. 5 g of 3-mercaptopropyltrimethoxysilane was added to this molten phenol novolac resin under stirring, after which 15 g of imidazolesilane (a compound obtained by reacting 1H-imidazole and 3-glycidoxy-propyltrimethoxysilane by the method discussed in Japanese Patent Publication 5-186479A) and 6 g of isopropanol were mixed and added, and the system was stirred for 1 hour after this addition. This reaction mixture was left in a 120° C. dryer for 1 hour. The reaction mixture was cooled to room temperature and then pulverized to obtain a solid silane coupling agent 1. It was confirmed that the solid silane coupling agent 1 thus obtained was soluble in DMF (dimethylformamide) and had not gelled.

Example 2

Synthesis was carried out by the same method as in Example 1, except that the 5 g of 3-mercaptopropyl-trimethoxysilane was changed to 10 g, and the 15 g of imidazolesilane was changed to 10 g, which gave a solid silane coupling agent 2. It was confirmed that the solid silane coupling agent 2 thus obtained was soluble in DMF (dimethylformamide) and had not gelled.

Example 3

Synthesis was carried out by the same method as in Example 1, except that the 5 g of 3-mercaptopropyl-trimethoxysilane was changed to 15 g, and the 15 g of imidazolesilane was changed to 5 g, which gave a solid silane coupling agent 3. It was confirmed that the solid silane coupling agent 3 thus obtained was soluble in DMF (dimethylformamide) and had not gelled.

Example 4

Synthesis was carried out by the same method as in Example 1, except that the 3-mercaptopropyltrimethoxysilane was changed to 3-methacryloxypropyltrimethoxysilane, which gave a solid silane coupling agent 4. It was confirmed that the solid silane coupling agent 4 thus obtained was soluble in DMF (dimethylformamide) and had not gelled.

Example 5

Synthesis was carried out by the same method as in Example 1, except that the 3-mercaptopropyltrimethoxysilane was changed to 3-glycidoxypropyltrimethoxysilane, which gave a solid silane coupling agent 5. It was confirmed that the solid silane coupling agent 5 thus obtained was soluble in DMF (dimethylformamide) and had not gelled.

Example 6

Synthesis was carried out by the same method as in Example 1, except that the 3-mercaptopropyltrimethoxysilane was changed to vinyltrimethoxysilane, which gave a solid silane coupling agent 6. It was confirmed that the solid silane coupling agent 6 thus obtained was soluble in DMF (dimethylformamide) and had not gelled.

Example 7

Synthesis was carried out by the same method as in Example 1, except that the imidazolesilane was changed to 3-aminopropyltrimethoxysilane, which gave a solid silane coupling agent 7. It was confirmed that the solid silane coupling agent 7 thus obtained was soluble in DMF (dimethylformamide) and had not gelled.

Comparative Example 1

Synthesis was carried out by the same method as in Example 2, except that the imidazolesilane was added without admixing the isopropyl alcohol, which gave a solid silane coupling agent 8. It was confirmed that the solid silane coupling agent 8 thus obtained did not dissolve in DMF (dimethylformamide) and had gelled.

Comparative Example 2

80 g of phenol novolac resin (softening point: 100° C.) was heated to 120° C. and melted. 20 g of 3-mercaptopropyl-trimethoxysilane was added to this molten phenol novolac resin under stirring, after which the system was stirred for 1 hour. This reaction mixture was left in a 120° C. dryer for 1 hour. The reaction mixture was cooled to room temperature, but its softening point was no more than 40° C. and it could not be pulverized.

Evaluation of Latent Curability

Example 8

Figure 2:
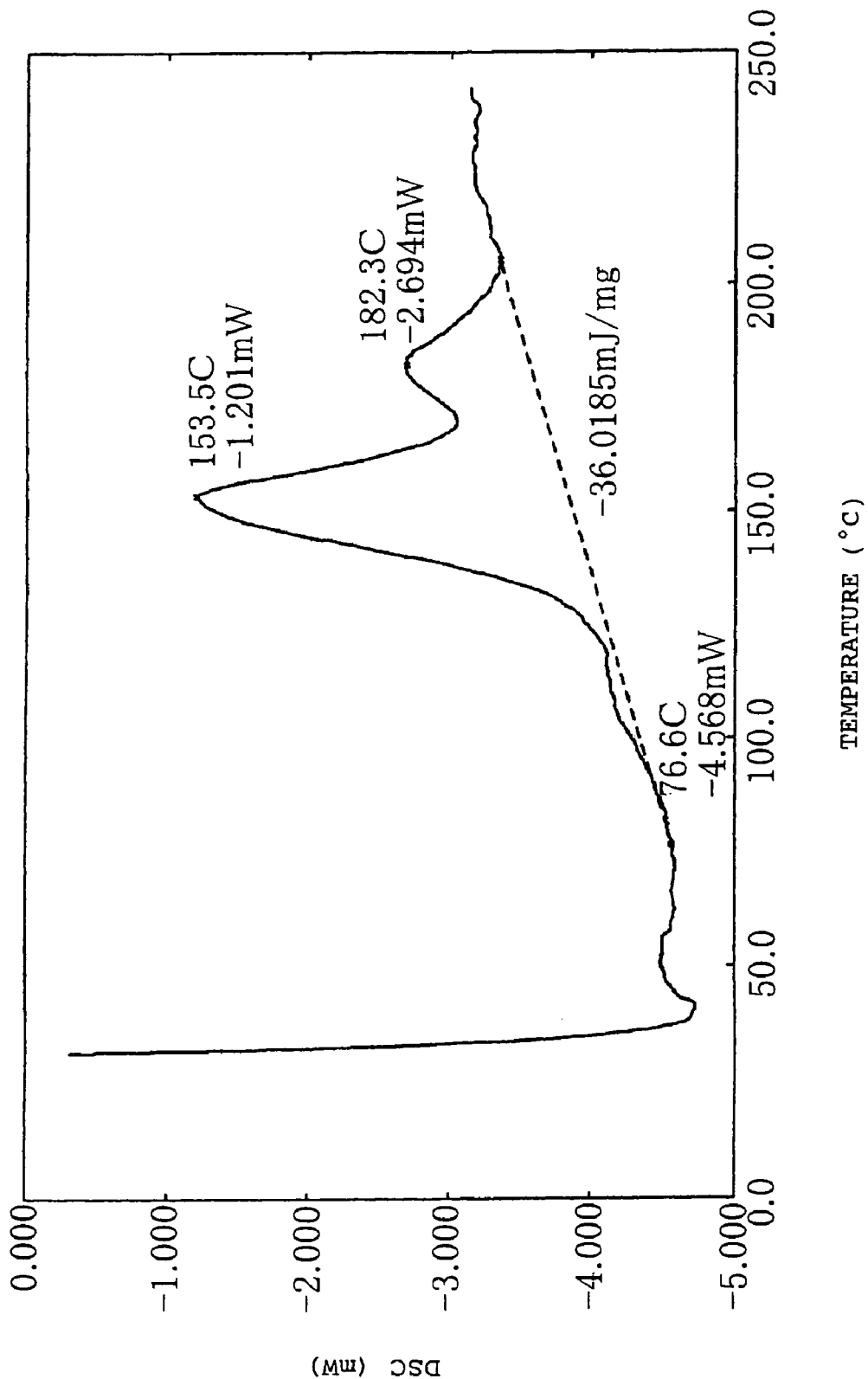
FIG. 2 is a graph of the DSC curve obtained in Example 8.
Figure 3:
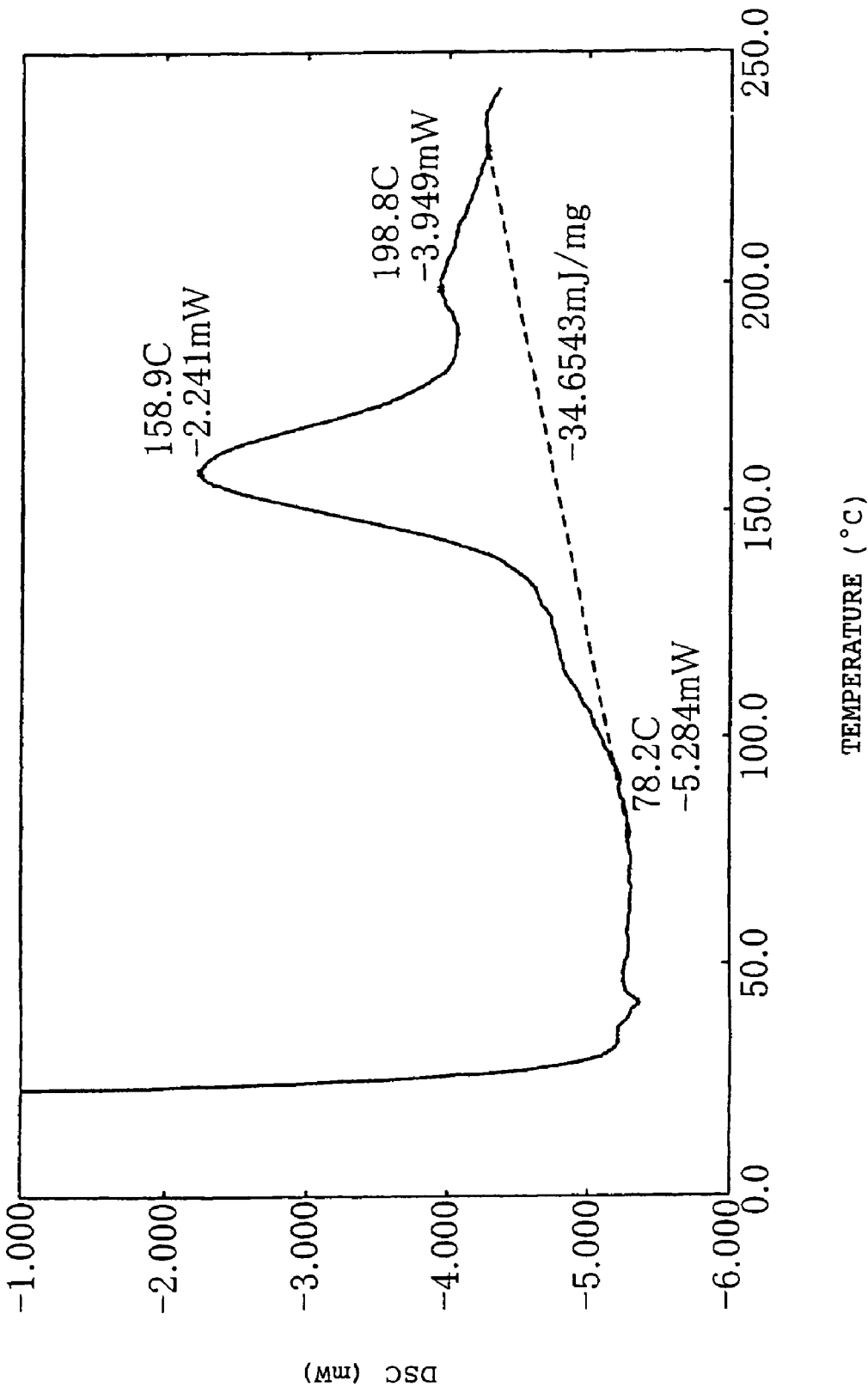
FIG. 3 is a graph of the DSC curve obtained in Example 8.

Three types of sample were prepared by mixing 5 g of one of the solid silane coupling agents 1, 2, and 3 into 100 g of an epoxy resin (Epikote 828 made by Japan Epoxy Resin K.K.). A Differential Scanning Calorimetric analysis (DSC analysis) was performed, the results of which are given in FIGS. 1 to 3.

These results confirmed the temperature at which a reaction with the epoxy resin commenced to be between 75 and 80° C., and that latent curability was exhibited. It was also confirmed that the peak temperature for an exothermic reaction gradually rises as the blend ratio of mercaptosilane (3-mercaptopropyltrimethoxysilane) and imidazolesilane increases. This means that reactivity can be controlled by varying the blend ratio, and the blend ratio can be selected as dictated by the intended use of the resin composition.

Evaluation of Adhesiveness

Example 9

Raw materials used to produce sealing material

| | |
|---|---|
| epoxy resin (biphenyl type, epoxy equivalent: 192): | 7.93 weight parts |
| phenol resin (phenol novolac, hydroxyl group equivalent: 106): | 4.38 weight parts |
| curing accelerator (TPP): | 0.25 weight part |
| carbon black: | 0.20 weight part |
| carnauba wax: | 0.25 weight part |
| filler: | 87.00 weight parts |

(spherical silica made by Tatsumori K.K., trade name MSR-25, average particle size: 25 μm)

Sealing Material Production Procedure

Raw material blend: filler, epoxy resin, phenol resin, TPP, carbon black, and carnauba wax were added in that order to an automatic mortar. Each silane coupling agent was added after the wax (the added silane coupling agents are shown below).

Dry blending: The materials were blended for about 10 minutes in an automatic mortar.

Hot kneading: The blended materials were heated to 90° C. and kneaded with a hot roll machine. Once the raw materials turned black, hot kneading was continued for about 4 more minutes.

Pulverization: Each resultant product was pulverized for about 30 minutes with a stamp mill.

Silane Coupling Agent Used

EXAMPLE 9-1

0.3 weight part of 3-glycidoxypropyltrimethoxysilane and 0.5 weight part of the solid silane coupling agent 1 were added as the silane coupling agents.

EXAMPLE 9-2

0.3 weight part of 3-glycidoxypropyltrimethoxysilane and 0.5 weight part of the solid silane coupling agent 2 were added as the silane coupling agents.

EXAMPLE 9-3

2.0 weight parts of the solid silane coupling agent 3 was added as the silane coupling agent.

Comparative Example 3

0.3 weight part of 3-glycidoxypropyltrimethoxysilane was added as the silane coupling agent.

Comparative Example 4

0.3 weight part of 3-mercaptopropyltrimethoxysilane and 0.1 weight part of imidazolesilane were added as the silane coupling agents. The sealing material thus obtained could not be evaluated for adhesion because it partially agglomerated.

Comparative Example 5

3-mercaptopropyltrimethoxysilane and phenol resin were mixed and dried by a conventional method to produce a reaction mixture containing 5% of 3-mercaptopropyltrimethoxy-silane. This reaction mixture was pulverized and added in an amount of 2.0 weight parts to the above-mentioned sealing material composition.

Evaluation Sample Production and Results

Each of the above-mentioned sealing materials was used to bond two sheets of copper alloy (C-7025, 50 mm×25 mm) at an overlap width of 12.5 mm×25 mm. The curing conditions comprised 8 hours at 175° C. Each test piece was pulled with a tensile tester and the shear strength was measured. The pulling rate here was 1 mm/min. These results are given in Table 1.

TABLE 1

|  | Example 9-1 | Example 9-2 | Example 9-3 | Comparative Example 3 | Comparative Example 5 |
| --- | --- | --- | --- | --- | --- |
| Shear adhesive strength (N/cm$^2$) | 335 | 321 | 404 | 255 | 245 |

It was confirmed from the above examples and comparative examples that ungelled solid silane coupling agents can be synthesized by the manufacturing method of the present invention, and that adhesive strength is increased both when the solid silane coupling agent of the present invention is added to the resin composition of Comparative Example 3 (as in Examples 9-1 and 9-2), and when the silane coupling agent of Comparative Example 3 is replaced with the silane coupling agent of the present invention.

It was also confirmed that adequate adhesion characteristics were not obtained with a mixture synthesized by a conventional method (Comparative Example 5).

Industrial Applicability

As described above, the silane coupling agent composition of the present invention is a solid and can be easily pulverized, so it readily forms a uniform mixture with resins or powdered sealing materials and powder paints. A resin to which this composition is added will have better adhesion to metals, inorganic materials, and organic materials. Further, latent curability affording excellent storage stability can be imparted.

What is claimed is:

1. A non-gelling, pulverizable solid silane coupling agent composition comprising a reaction product of the following components:
   (A) 1 to 40 wt% of a silane coupling agent containing one or more functional groups selected from the group consisting of a vinyl group, glycidyl group, styryl group, methacryl group, acryl group, ureido group, chloro alkyl group, mercapto group, and isocyanate group;
   (B) 1 to 40 wt% of a silane coupling agent containing one or more functional groups selected from the group consisting of an amino group, dimethylamino group, and imidazole group; and
   (C) 50 to 90 wt% of a phenol compound.

2. A method for manufacturing a non-gelling, pulverizable, solid silane coupling agent composition, the method comprising:
   causing the silane coupling agent (A), the silane coupling agent (B), and the phenol compound (C) described in claim 1 to react in the presence of an alcohol at 60 to 150° C.; and
   drying the reaction product at 90 to 150° C.

3. A method for manufacturing a non-gelling, pulverizable, solid silane coupling agent composition, the method comprising:
   adding the silane coupling agent (A) described in claim 1, a mixed solution of the silane coupling agent (B) described in claim 1 and an alcohol to the phenol compound (C) described in claim 1 which has been melted by heating at 60 to 150° C.;
   causing the resultant mixture to react at 60 to 150° C.; and
   drying the reaction product at 90 to 150° C., whereby the silane coupling agent composition is obtained.

4. A non-gelling, pulverizable, solid silane coupling agent composition, obtained by causing the silane coupling agent (A), the silane coupling agent (B) and the phenol compound (C) described in claim 1 to react in the presence of an alcohol at 60 to 150° C., and then drying the reaction product at 90 to 150° C.

5. The non-gelling, pulverizable, solid silane coupling agent composition according to claim 1, wherein the phenol compound (C) is a phenol resin.

6. The non-gelling, pulverizable, solid silane coupling agent composition according to claim 1, wherein the combined amount of the silane coupling agents (A) and (B) is at least 10 wt %.

7. A resin composition containing the non-gelling, pulverizable, solid silane coupling agent composition according to claim 1.

8. The resin composition according to claim 7, containing an inorganic filler.

9. A cured resin, obtained by heating the resin composition according to claim 7.

10. A powder paint containing the non-gelling, pulverizable, solid silane coupling agent composition according to claim 1.

11. A sealing material containing the non-gelling, pulverizable, solid silane coupling agent composition according to claim 1.

* * * * *